United States Patent
Prevost et al.

(10) Patent No.: US 10,291,223 B2
(45) Date of Patent: *May 14, 2019

(54) RF SWITCH WITH BYPASS TOPOLOGY

(71) Applicant: pSemi Corporation, San Diego, CA (US)

(72) Inventors: Ethan Prevost, San Diego, CA (US); Michael Conry, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,907

(22) Filed: Jun. 25, 2018

(65) Prior Publication Data

US 2018/0375510 A1    Dec. 27, 2018

Related U.S. Application Data

(63) Continuation-in-part of application No. 15/698,088, filed on Sep. 7, 2017, which is a continuation of application No. 15/426,848, filed on Feb. 7, 2017, now Pat. No. 9,800,238, which is a continuation of application No. 14/811,159, filed on Jul. 28, 2015, now Pat. No. 9,602,098.

(51) Int. Cl.
*H03K 17/16* (2006.01)
*H03K 17/30* (2006.01)
*H04B 1/04* (2006.01)

(52) U.S. Cl.
CPC ......... *H03K 17/165* (2013.01); *H04B 1/0458* (2013.01)

(58) Field of Classification Search
CPC ..................... H03K 17/165; H04B 1/0458
USPC ................................................. 327/379
See application file for complete search history.

(56) References Cited

U.S. PATENT DOCUMENTS

| | | |
|---|---|---|
| 9,602,098 B2 | 3/2017 | Prevost |
| 9,800,238 B2 | 10/2017 | Prevost |
| 2009/0207764 A1 | 8/2009 | Fukamachi et al. |
| 2013/0200710 A1 | 8/2013 | Robbins |
| 2015/0055733 A1* | 2/2015 | Asano ............ H04B 1/525 375/297 |
| 2015/0145614 A1 | 5/2015 | Whitefield et al. |

(Continued)

FOREIGN PATENT DOCUMENTS

WO    2017019412    2/2017

OTHER PUBLICATIONS

Retebo, Metasebia T., Office Action received from the USPTO dated May 8, 2017 for U.S. Appl. No. 15/426,848, 7 pgs.

(Continued)

*Primary Examiner* — Metasebia T Retebo
(74) *Attorney, Agent, or Firm* — Jaquez Land Greenhaus LLP; Martin J. Jaquez, Esq.; John Land, Esq.

(57) ABSTRACT

An RF signal switch circuit that allows connection of any of N radio frequency (RF) input terminals to a switch output port, either in a low loss mode, in a bypass mode, or, optionally, in a signal function mode. Embodiments of the invention allow for both a single switch in the series input path to a target circuit while still having the ability to isolate the bypass path from the target circuit. In the low loss and bypass mode, the circuit simultaneously exhibits low input insertion loss (and thus a low noise factor) and high bypass mode isolation.

19 Claims, 11 Drawing Sheets

(56) References Cited

U.S. PATENT DOCUMENTS

| | | |
|---|---|---|
| 2016/0056774 A1* | 2/2016 | Ilkov .................... H03F 1/565 330/251 |
| 2017/0033786 A1 | 2/2017 | Prevost |
| 2017/0149429 A1 | 5/2017 | Prevost |
| 2018/0131366 A1 | 5/2018 | Prevost |

OTHER PUBLICATIONS

Retebo, Metasebia T., Final Office Action received from the USPTO dated Jul. 27, 2017 for U.S. Appl. No. 15/426,848, 10 pgs.
Retebo, Metasebia T., Notice of Allowance received from the USPTO dated Aug. 10, 2017 for U.S. Appl. No. 15/426,848, 7 pgs.
Prevost, Ethan, Preliminary Amendment filed in the USPTO dated Mar. 13, 2017 for U.S. Appl. No. 15/426,848, 8 pgs.
Prevost, Ethan, Response filed in the USPTO dated Jun. 8, 2017 for U.S. Appl. No. 15/426,848, 10 pgs.
Prevost, Ethan, Response filed in the USPTO dated Jul. 31, 2017 for U.S. Appl. No. 15/426,848, 10 pgs.
Retebo, Metasebia, Office Action received from the USPTO dated Sep. 20, 2016 for U.S. Appl. No. 14/811,159, 7 pgs.
Retebo, Metasebia, Notice of Allowance received from the USPTO dated Dec. 12, 2016 for U.S. Appl. No. 14/811,159, 8 pgs.
Lindberg, Per, International Search Report and Written Opinion received from the EPO dated Oct. 27, 2016 for appln. No. PCT/US2016/043171, 10 pgs.
Prevost, Ethan, Response filed in the USPTO dated Oct. 28, 2016 for U.S. Appl. No. 14/811,159, 13 pgs.
Peregrine Semiconductor Corporation, Demand and Response filed in the EPO dated Mar. 23, 2017 for appln. No. PCT/US2016/043171, 22 pgs.
Toscano, Oliveros L., International Preliminary Report on Patentability received from the EPO dated Jul. 10, 2017 for appln. No. PCT/2016/043171, 21 pgs.
Retebo, Metasebia, Office Action received from the USPTO dated Feb. 23, 2018 for U.S. Appl. No. 15/698,088, 6 pgs.
Retebo, Metasebia, Final Office Action received from the USPTO dated Jun. 28, 2018 for U.S. Appl. No. 15/698,088, 9 pgs.
Prevost, Response filed in the USPTO dated May 21, 2018 for U.S. Appl. No. 15/698,088, 4 pgs.

* cited by examiner

Low Input IL, Low Isolation

High Input IL, High Isolation

Low Input IL, High Isolation

In-circuit Mode

Bypass Mode

Alternative Bypass Circuit

Bypass Mode

Low Loss Mode

Signal Function Mode

RF SWITCH WITH BYPASS TOPOLOGY

CROSS-REFERENCE TO RELATED APPLICATIONS

The present application is a continuation-in-part of, and claims priority to, like-named co-pending and commonly assigned U.S. patent application Ser. No. 15/698,088, filed Sep. 7, 2017, which is a continuation of U.S. patent application Ser. No. 15/426,848, filed Feb. 7, 2017 (now U.S. Pat. No. 9,800,238, issued Oct. 24, 2017), which is a continuation of U.S. patent application Ser. No. 14/811,159, filed Jul. 28, 2015 (now U.S. Pat. No. 9,602,098, issued Mar. 21, 2017), the contents of all of which are hereby incorporated by reference.

BACKGROUND

(1) Technical Field

This invention relates to electronic radio frequency (RF) circuits, and more particularly to RF signal switching circuits.

(2) Background

Radio frequency (RF) signal switches are common circuits for routing RF signals between various parts of an RF system, such as between one or more antennas and one or more transmitter and/or receiver circuits. For example, RF signal switches are used in such devices as one-way and two-way radios, including cellular telephones, and in global positioning system (GPS) devices.

It is fairly common to use RF signal switches in electronic systems that are sensitive to noise, such as radio signal receivers. Such receivers are often presented with very weak signals (for example, transmitted radio waves captured by an antenna), and accordingly, it is common to use a low-noise amplifier (LNA) to amplify such signals. It is also common to provide a matching network at the input of the LNA to maximize power transfer to the LNA.

The noise figure (NF) of a low noise amplifier (LNA) is very sensitive to the impedance presented and the insertion loss (IL) in front of the input to the LNA. For example, in a typical cellular radio LNA configuration, a set of bandpass filters in series with an RF switch exist at the input of the LNA and are used to select a specific band to be presented to a radio transceiver. In order to reduce the NF, RF signal switches with low insertion loss (IL) are required. However, in some modes of operation, the LNA must be bypassable, and in such a mode, the LNA should be isolated from the bypass signal path.

For example, FIG. 1 is a schematic diagram of a prior art RF signal switch 100 in which one of N RF input terminals $RF_1$-$RF_N$ may be connected to a Switch Output port, either through a matching network and LNA block 102 or through a bypass path 104. The RF input terminals $RF_1$-$RF_N$ may be connected to respective antennas; the matching network and LNA block 102 are generally external to the RF signal switch 100, as indicated by the dashed lines.

In the illustrated example, in an "in-circuit" mode, the input terminal $RF_1$ may be connected to the matching network and LNA block 102 by closing the corresponding series switch $S_1$, opening a corresponding shunt switch $Sh_1$, opening the Bypass Switch, closing an output connector switch $S_C$, and opening an output connector shunt switch $Sh_C$. In this mode, for each other RF input terminal $RF_2$-$RF_N$, the corresponding series switch $S_2$-$S_N$ is open and the corresponding shunt switch $S_2$-$S_N$ is closed. Any other RF input terminal $RF_2$-$RF_N$ may be connected in-circuit to the matching network and LNA block 102 in a similar manner.

In a bypass mode, the input terminal $RF_1$ may be connected directly to the Switch Output by closing the corresponding series switch $S_1$, opening the corresponding shunt switch $Sh_1$, closing the Bypass Switch, opening the output connector switch Sc, and closing the output connector shunt switch $Sh_C$. In this mode, for each other RF input terminal $RF_2$-$RF_N$, the corresponding series switch $S_2$-$S_N$ is open and the corresponding shunt switch $S_2$-$S_N$ is closed. Any other RF input terminal $RF_2$-$RF_N$ may be connected to bypass the matching network and LNA block 102 in a similar manner.

A problem with the circuit configuration shown in FIG. 1 is that the matching network at the input of the LNA is not isolated from the bypass path 104 when the LNA is not active. The matching network can adversely affect the output impedance of the RF signal switch 100 and cause the IL of the bypass path 104 to be degraded, the severity of which is dependent on the design and component values of the LNA input matching network. This degradation of the bypass path IL causes module designers to struggle to find a balance between having a good LNA input match and maintaining a low bypass path IL.

If it is desired to isolate the bypass path from the LNA input matching network, standard practice is to add another series/shunt switch pair before the matching network. For example, FIG. 2 is a schematic diagram of the prior art RF signal switch of FIG. 1 in which an isolation series/shunt switch pair $S_I$/$Sh_I$ 106 are connected before the matching network and LNA block 102. In the bypass mode, the isolation series switch $S_I$ is open and the isolation shunt switch $Sh_I$ is closed, thereby coupling the matching network input to circuit ground and completely isolating the matching network from the bypass path 104. Conversely, in the in-circuit mode, the isolation series switch $S_I$ is closed and the isolation shunt switch $Sh_I$ is open.

However, a downside of the circuit configuration shown in FIG. 2 is that the added series switch $S_I$ increases the input IL to the LNA compared to the configuration shown in FIG. 1, and thus increases the system NF. This is so because the illustrated switches are not perfect conductors when closed, but exhibit some amount of impedance.

Further, in some applications, greater flexibility with respect to switching paths is desirable. For example, LNA circuits are becoming more complicated, often requiring tunable gain states. For such applications, it would be desirable to have an option to choose a high loss signal path for the LNA input for gain tuning while maintaining both a low loss signal path option for high gain and a low NF, and a high isolation bypass signal path. As another example, rather than having a selectable high loss signal path, it may be desirable in some applications to selectively apply a signal function that intentionally alters an RF signal in a desired manner, such as by altering signal phase and/or signal amplitude (e.g., by attenuation or amplification).

Accordingly, there is a need for an RF signal switching circuit that simultaneously exhibits low input IL (and thus a low NF) and high isolation. There is also a need for an RF signal switching circuit that simultaneously provides a signal function mode, a low loss mode, and a high isolation bypass mode. The present invention addresses these needs.

SUMMARY OF THE INVENTION

The invention encompasses embodiments of an RF signal switch circuit that allows connection of any of N RF input terminals $RF_1$-$RF_N$ to a Switch Output port, either in a low loss mode or in a bypass mode. Embodiments of the invention allow for both a single switch in the series input path to a target circuit while still having the ability to isolate the bypass path from the target circuit. In both modes, the circuit simultaneously exhibits low input IL (and thus a low NF) and high bypass mode isolation. Variant embodiments include both a low loss mode and a bypass mode, as well as a signal function mode.

In one dual-mode embodiment, an in-circuit path of the RF signal switch circuit is coupled to the input of an isolation and/or insertion loss sensitive target circuit (such as an LNA or a digital step attenuator) that may include an optional matching network. The target circuit and the optional matching network are typically off-circuit with respect to the RF signal switch circuit, but the entire circuit may be fabricated as a hybrid or monolithic structure. In some embodiments, the matching network may be integrated with the target circuit.

In one dual-mode embodiment, each of the RF input terminals $RF_1$-$RF_N$ is directly connected to three corresponding switches: an in-path connector switch $IC\_S_x$, a shunt switch $Sh_x$, and a bypass switch $BP\_S_x$ (where "x" represents the corresponding RF input terminal identifier, from 1 to N, and where N may be 1). For each of the RF input terminals $RF_1$-$RF_N$, all of the in-path connector switches $IC\_S_x$ and an isolation shunt switch $Sh_I$ are connected to an in-circuit path. In alternative embodiments, each of the RF input terminals $RF_1$-$RF_N$ may have one or more sets of in-path connector switch $IC\_S_x$, and corresponding isolation shunt switches $Sh_I$ connected to parallel in-circuit paths. Such a configuration would, for example, allow multiple antennas to be selectively coupled to multiple target circuits without increasing the number of series switches to any one target circuit. The output of the target circuit is connected to a switch return path, which is in turn selectively connectable to the Switch Output of the RF signal switch circuit through an output connector series switch $S_C$, or to circuit ground through an output connector shunt switch $Sh_C$. In operation, an RF signal applied to any of the RF input terminals $RF_1$-$RF_N$ may be connected to the target circuit through a single switch (and then to the Switch Output), or applied to a bypass path to the Switch Output with complete isolation of any matching network coupled to the switching circuit.

Three-mode embodiments of the invention that include a bypass mode, a low loss mode, and a signal function mode include an RF signal switch circuit having at least one first type RF signal port, each first type RF signal port having a first shunt switch coupled to the first type RF signal port and configured to selectively couple the first type RF signal port to circuit ground, a first series switch coupled between the first type RF signal port and configured to be coupled to at least one corresponding target circuit, and at least one set of second series switches coupled to the first type RF signal port; at least one first circuit path each coupled to a corresponding second shunt switch and coupled to a corresponding one set of second series switches, each first circuit path being configured to be coupled to at least one signal function circuit; at least one second circuit path configured to be coupled to the at least one signal function circuit, and being coupled to a corresponding third shunt switch; at least one third series switch coupled to a corresponding one second circuit path and to at least one first series switch; at least one second type RF signal port; and a switching network coupled to the at least one second type RF signal port, the switching network including at least one first switch path each having a series switch coupled to at least one second type RF signal port and configured to be coupled to one corresponding target circuit, and a shunt switch coupled to a node between such series switch and such corresponding target circuit and configured to selectively couple that node to circuit ground, and at least one second switch path each having a first series switch coupled to the at least one second type RF signal port, a second series switch coupled to the first series switch and to at least one second circuit path, and a shunt switch coupled to a node between the first and second series switches and configured to selectively couple that node to circuit ground.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Dual Mode Embodiments

Figure 3:
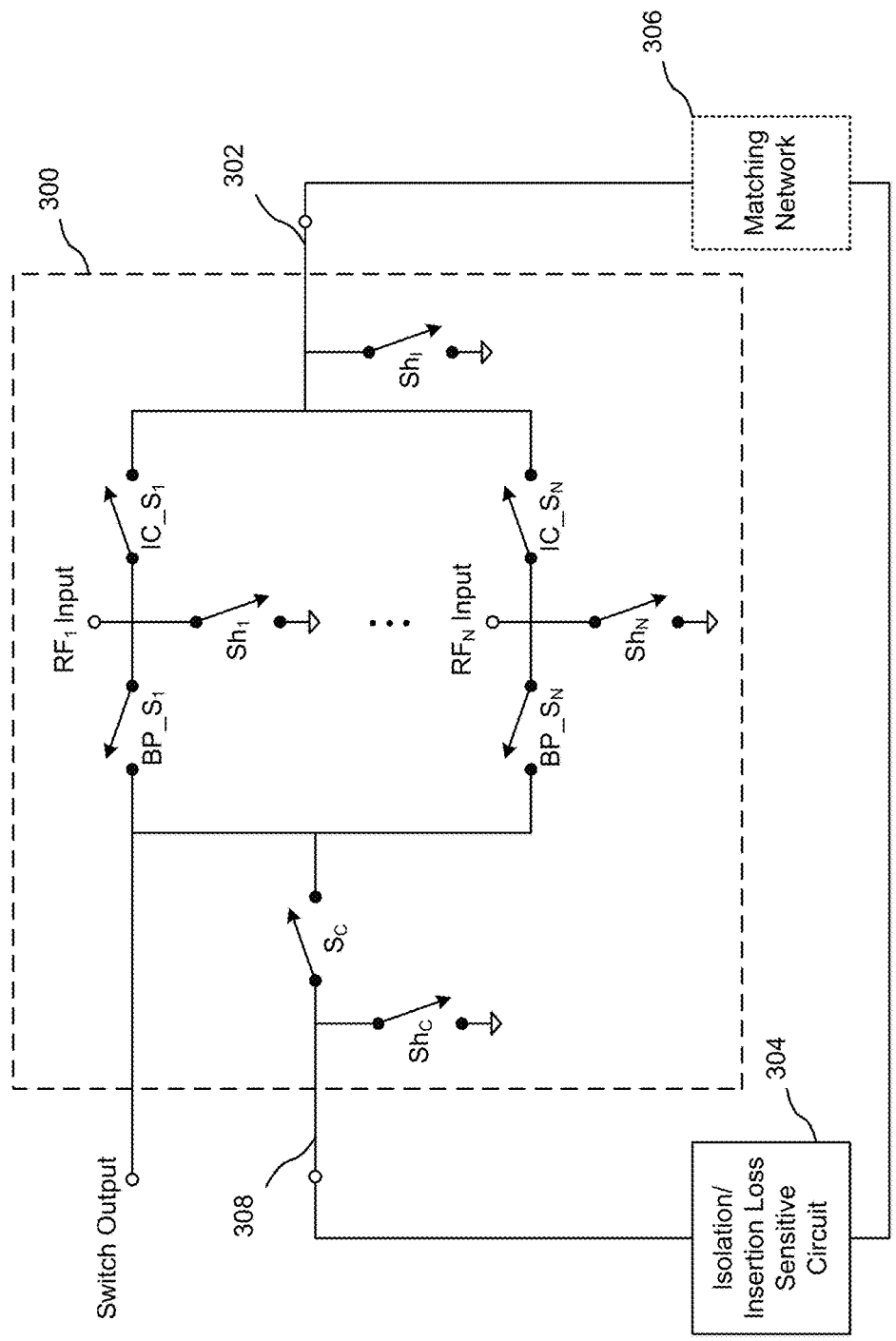
FIG. 3 is a schematic diagram of an embodiment of a dual-mode RF signal switch circuit in accordance with the present invention.

FIG. 3 is a schematic diagram of an embodiment of a dual-mode RF signal switch circuit 300 in accordance with the present invention. The RF signal switch circuit 300 allows connection of any of N RF input terminals $RF_1$-$RF_N$ to a Switch Output port, either in an in-circuit mode or in a bypass mode. Embodiments of the invention allow for both a single switch in the series input path while still having the ability to isolate the bypass path from an input matching network. In both modes, the circuit simultaneously exhibits low input IL (and thus a low NF) and high bypass mode isolation.

In the illustrated embodiment, an in-circuit path 302 of the RF signal switch circuit 300 is configured to be coupled to the input of an isolation and/or insertion loss sensitive target circuit 304 (such as an LNA or a digital step attenuator) directly or through an optional matching network 306 (shown in dotted outline). The target circuit 304 and the matching network 306 are typically off-circuit with respect to the RF signal switch circuit 300, but the entire circuit illustrated in FIG. 3 may be fabricated as a hybrid or monolithic structure. In some embodiments, the matching network 306 may be integrated with the target circuit 304. However, for convenience, the description below will treat the target circuit 304 and the matching network 306 as separate elements.

In the illustrated embodiment, each of the RF input terminals $RF_1$-$RF_N$ is directly connected to three corresponding switches: an in-path connector switch $IC\_S_x$, a shunt switch $Sh_x$, and a bypass switch $BP\_S_x$ (where "x" represents the corresponding RF input terminal identifier, from 1 to N, and where N may be 1). For each of the RF input terminals $RF_1$-$RF_N$, all of the in-path connector switches $IC\_S_x$ and an isolation shunt switch $Sh_I$ are connected to the in-circuit path 302.

The RF signal switch includes a switch return path 308 configured to be coupled to the output of the target circuit 304. The switch return path 308 is in turn selectively connectable to the Switch Output of the RF signal switch circuit 300 through an output connector series switch $S_C$, or to circuit ground through an output connector shunt switch $Sh_C$.

In alternative embodiments, the RF input terminals $RF_1$-$RF_N$ may have one or more sets of in-path connector switch $IC\_S_x$ and corresponding isolation shunt switches $Sh_I$ connected to parallel in-circuit paths 302. Such a configuration would, for example, allow multiple antennas to be selectively coupled to multiple target circuits 304 without increasing the number of series switches to any one target circuit 304. In such a configuration, the RF signal switch 300 would have parallel switch return paths 308, each configured to be coupled to a corresponding target circuit 304, a corresponding output connector series switch $S_C$, and a corresponding output connector shunt switch $Sh_C$.

All of the switches described above for FIG. 3 may be controlled by external switching circuitry (not shown) of conventional design to set either open states or closed states for the switches.

Figure 4A:
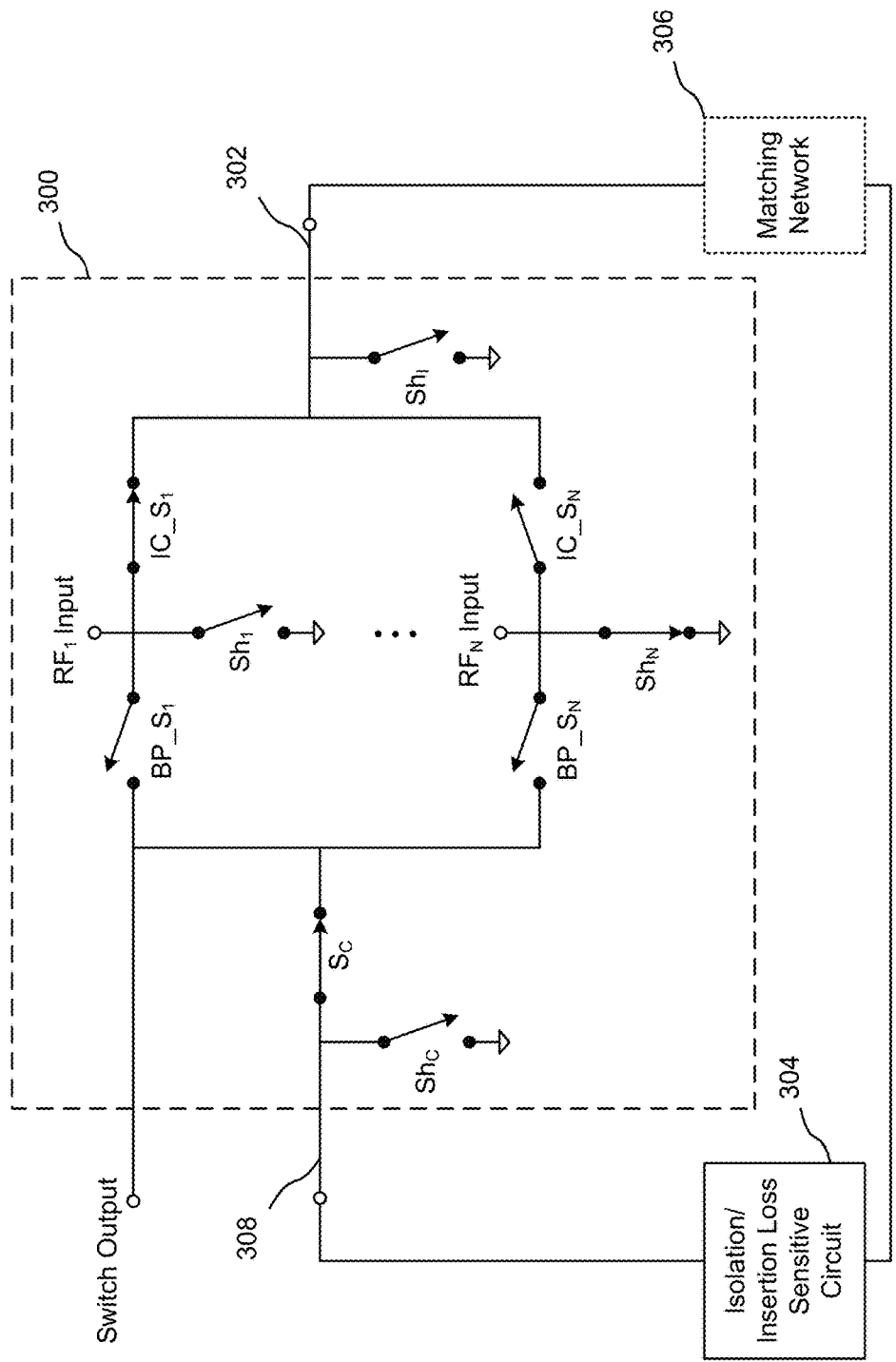
FIG. 4A is a schematic diagram of the embodiment shown in FIG. 3 configured in an in-circuit mode.

FIG. 4A is a schematic diagram of the embodiment shown in FIG. 3 configured in an in-circuit mode. In this example, a signal applied to RF input terminal $RF_1$ is coupled through the closed in-path connector switch $IC\_S_1$ to the in-circuit path 302, through the matching network 306 to the target circuit 304, back to the switch return path 308 and through the closed output connector series switch Sc, and then to the Switch Output. The shunt switch $Sh_1$ and the bypass switch $BP\_S_1$ for the RF input terminal $RF_1$ are open, as are the isolation shunt switch $Sh_I$ and the output connector shunt switch $Sh_C$.

Each of the other RF input terminals $RF_2$-$RF_N$ are shunted to circuit ground through their corresponding shunt switch $Sh_2$-$Sh_N$, and their corresponding in-path connector switches $IC\_S_2$ to $IC\_S_N$ and bypass switches $BP\_S_2$ to $BP\_S_N$ are open, thus isolating the RF input terminals $RF_2$-$RF_N$ from the active signal path through RF input terminal $RF_1$.

In the configuration shown in FIG. 4A, the input signal at the RF input terminal $RF_1$ passes through only one switch ($IC\_S_1$) before being coupled to the matching network 306, thus minimizing insertion loss to the matching network 306 and target circuit 304.

Figure 4B:
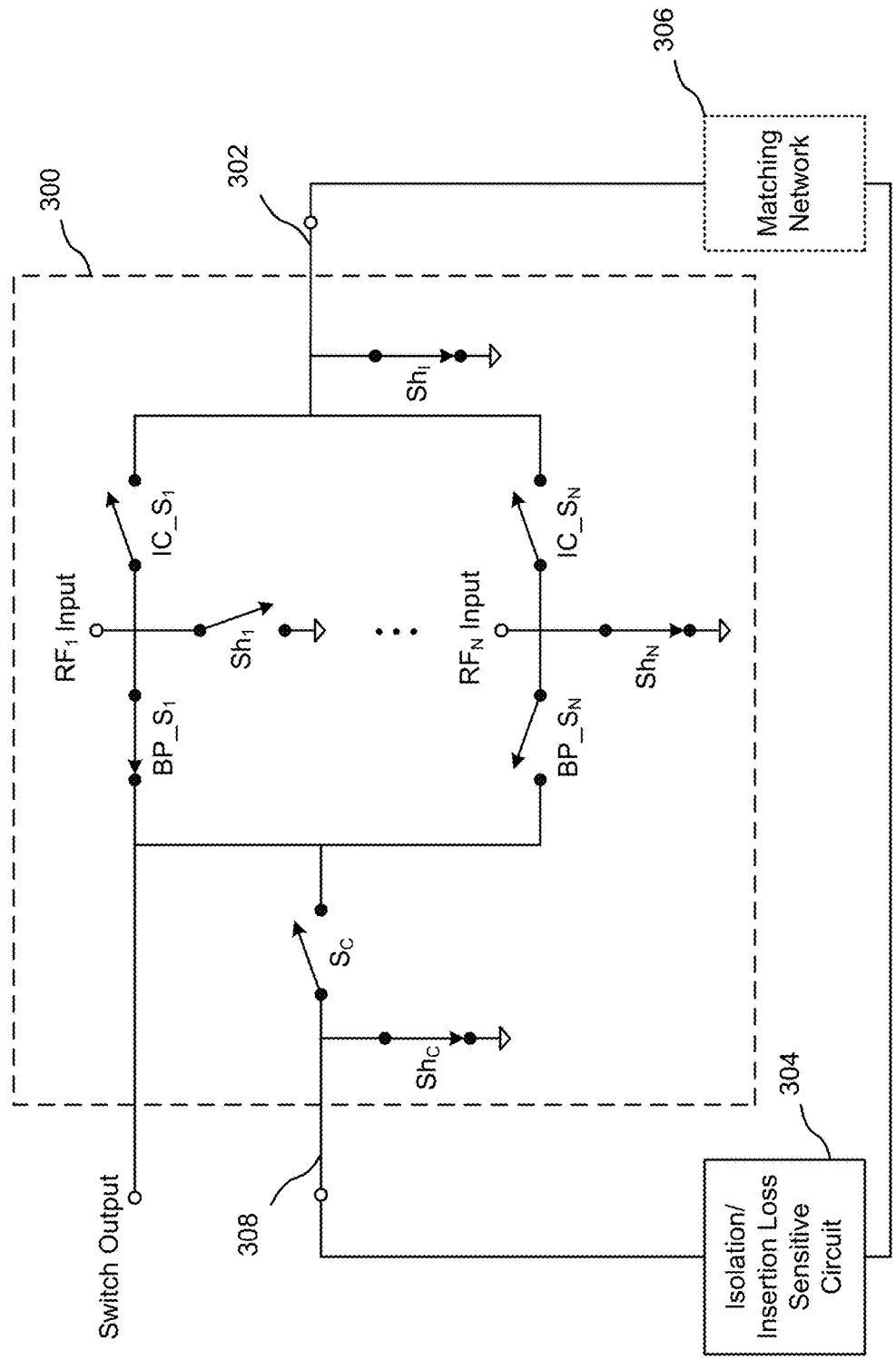
FIG. 4B is a schematic diagram of the embodiment shown in FIG. 3 configured in a bypass mode.

FIG. 4B is a schematic diagram of the embodiment shown in FIG. 3 configured in a bypass mode. In this example, a signal applied to RF input terminal $RF_1$ is coupled through the closed bypass switch $BP\_S_1$ to the Switch Output. The shunt switch $Sh_1$ and the in-path connector switch $IC\_S_1$ for the RF input terminal $RF_1$ are open. The isolation shunt switch $Sh_I$ and the output connector shunt switch $Sh_C$ are both closed, thereby coupling the input to the matching network 306 and the output of the target circuit 304 to circuit ground.

Each of the other RF input terminals $RF_2$-$RF_N$ are again shunted to circuit ground through their corresponding shunt switch $Sh_2$-$Sh_N$, and their corresponding in-path connector switches $IC\_S_2$ to $IC\_S_N$ and bypass switches $BP\_S_2$ to $BP\_S_N$ are open, thus isolating the RF input terminals $RF_2$-$RF_N$ from the active signal path through RF input terminal $RF_1$.

In the configuration shown in FIG. 4B, the input signal at the RF input terminal $RF_1$ passes through only one switch ($BP\_S_1$) before being coupled to the Switch Output, and is completely isolated from the matching network 306 and the target circuit 304.

As should be clear, any other RF input terminal $RF_2$-$RF_N$ may be connected in an in-circuit mode or in a bypass mode in a similar manner. In the case of multiple target circuits 304, each inactive target circuit 304 would be isolated by appropriate settings of the shunt and series switches of the corresponding in-circuit path 302 and switch return path 308 (for example, by opening the corresponding in-circuit connector switch IC_Sx, closing the corresponding isolation shunt switch $Sh_I$, opening the corresponding output connector series switch Sc, and closing the corresponding output connector shunt switch $Sh_C$).

Alternative Bypass Switch Circuit

For the example shown in FIG. 3, if even higher isolation of the Switch Output from the input of the target circuit 304 is desired, the corresponding bypass switches $BP\_S_1$ to $BP\_S_N$ may be replaced by a "T" type series/shunt/series circuit bypass switch configuration. This may be useful to better isolate the Switch Output from the input of the target circuit 304, since a single bypass switch $BP\_S_1$ (particularly one implemented as a field effect transistor) may behave as a capacitor capable of passing some amplified signal frequencies present on the Switch Output over to the input of the target circuit 304. Better isolation will prevent feedback and increase the stability of the target circuit 304. However, if the target circuit 304 does not provide amplification (e.g., if the target circuit is a digital step attenuator), then the simpler single-switch bypass switches $BP\_S_1$ to $BP\_S_N$ shown in FIG. 3 may be preferred.

Figure 5:
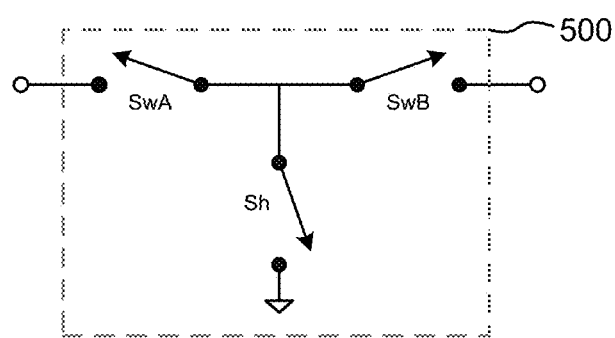
FIG. 5 is a schematic diagram of a high-isolation "T" type series/shunt/series bypass switch replacement circuit for each of the bypass switches $BP\_S_1$ to $BP\_S_N$ shown in FIG. 3.

FIG. 5 is a schematic diagram of a high-isolation "T" type series/shunt/series bypass switch replacement circuit 500 for each of the bypass switches $BP\_S_1$ to $BP\_S_N$ shown in FIG. 3. For an active signal path (e.g., for a signal applied to RF input terminal $RF_1$) in the bypass mode, series switch SwA is closed, series switch SwB is closed, and shunt switch Sh is open, thus allowing signal propagation from the RF input terminal $RF_1$ to the Switch Output (but with slightly worse bypass path IL because of the addition of a second series switch compared to the single-switch bypass switches $BP\_S_1$ to $BP\_S_N$ shown in FIG. 3).

For an active signal path in the in-circuit mode and for inactive signal paths in either mode, series switch SwA is open, series switch SwB is open, and shunt switch Sh is closed, thus grounding the junction between the two series switches SwA, SwB and thereby significantly increasing the isolation of the input to the target circuit 304 from the Switch Output.

Simulation Results

Figure 1:
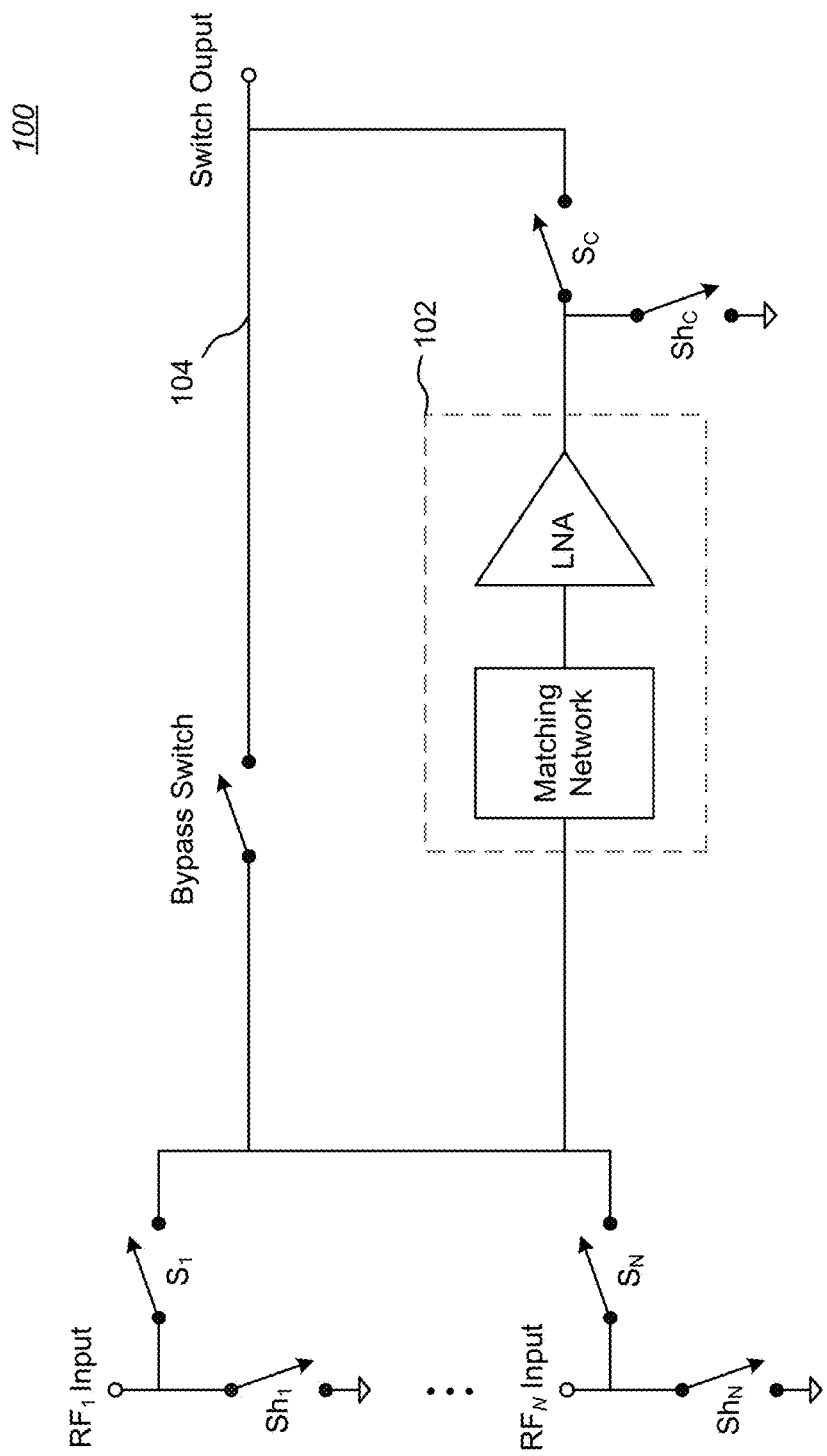
FIG. 1 is a schematic diagram of a prior art RF signal switch in which one of N RF input terminals $RF_1$-$RF_N$ may be connected to a Switch Output either through a matching network and LNA block, or through a bypass path.
Figure 2:
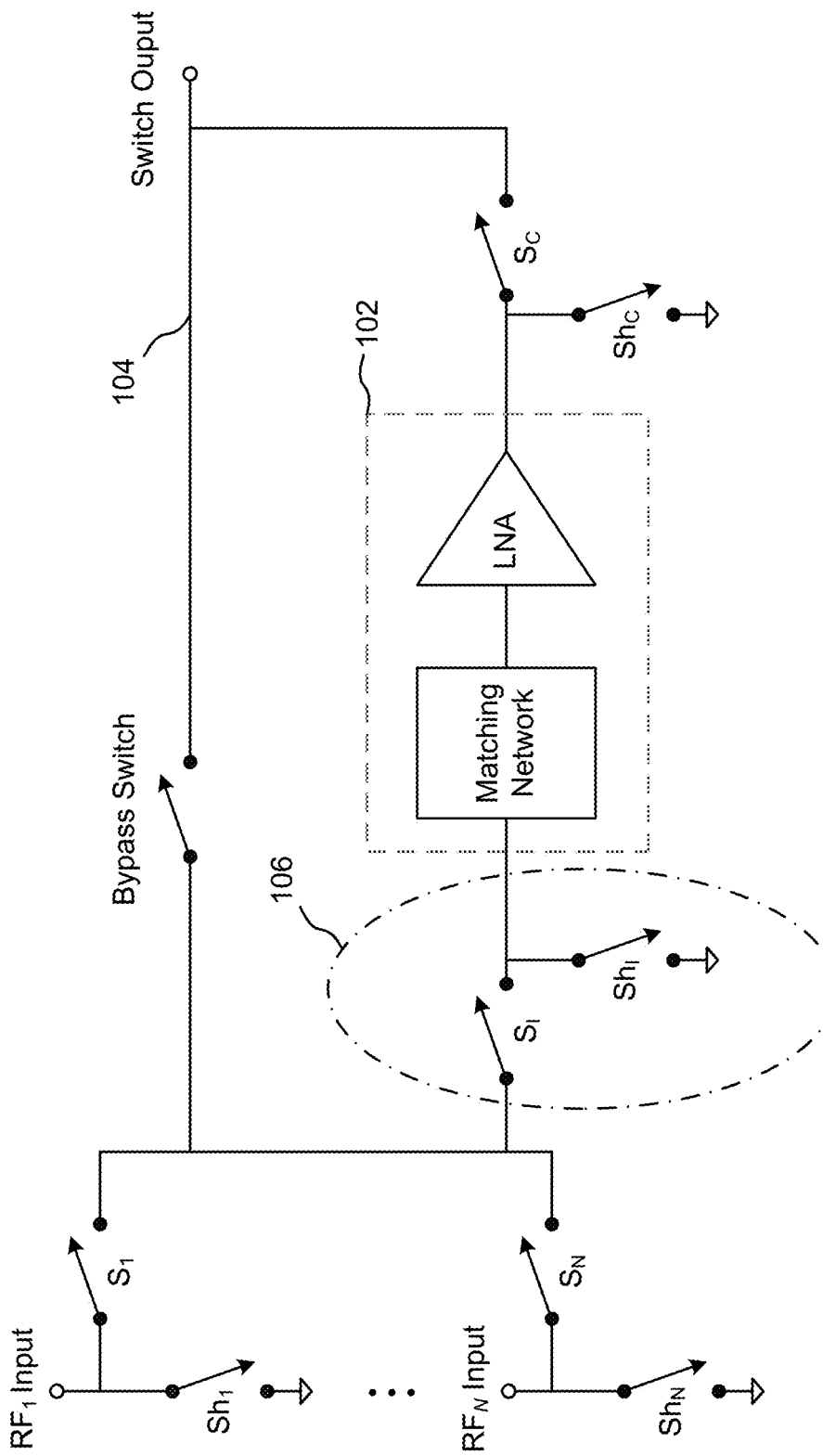
FIG. 2 is a schematic diagram of the prior art RF signal switch of FIG. 1 in which an isolation series/shunt switch pair $S_I/Sh_I$ is connected before the matching network and LNA block.

The two circuit topologies shown in FIG. 1 and FIG. 2 and the novel circuit topology shown in FIG. 3 were simulated for comparison using selected resistors, capacitors, inductors, and the scattering parameters (S-parameters) of a selected LNA. Since FET switches are known to behave as capacitors when open (non-conducting) and resistors when closed (conducting), in the simulation capacitors were used to represent open switches and resistors were used to represent closed switches. The capacitive and resistive values were chosen based on current RF switch IC technology. The inductors were used on the port locations to simulate an expected exterior matching network. The S-parameters were measured on a typical LNA (turned off) with an adjoining matching network that could be used in conjunction with such switches. This was done to introduce the effect the turned-off LNA with input matching network would have if its input was not properly isolated from the bypass path. The bypass switch was simulated using the high-isolation series/shunt/series configuration shown in FIG. 5.

Figure 6A:
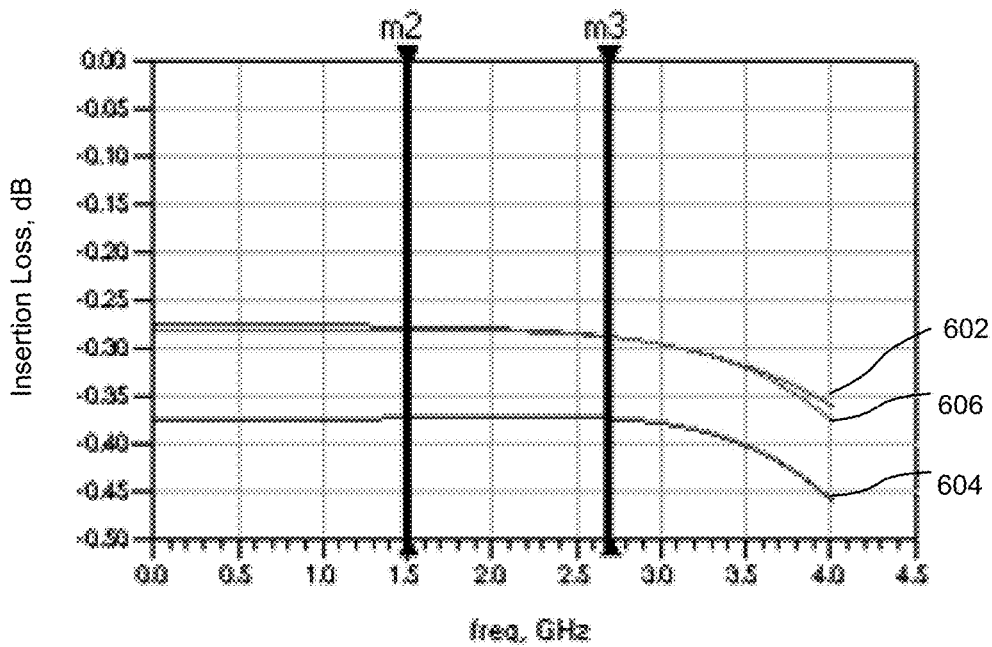
FIG. 6A is a graph comparing the insertion loss of the series input path to the LNA versus frequency for each of the three simulated circuit topologies from FIG. 1, FIG. 2, and FIG. 3.

FIG. 6A is a graph 600 comparing frequency versus the insertion loss of the series input path to the LNA for each of the three simulated circuit topologies from FIG. 1 (curve 602), FIG. 2 (curve 604), and FIG. 3 (curve 606). Point m2 represents a frequency of about 1.5 GHz, and point m3 represents a frequency of about 2.69 GHz. The FIG. 1 (curve 602) and FIG. 3 (curve 606) circuit topologies have similar IL performance, but the FIG. 2 (curve 604) circuit topology (with better isolation than the FIG. 1 circuit topology) has degraded IL due to the addition of a second switch in the series input path.

Figure 6B:
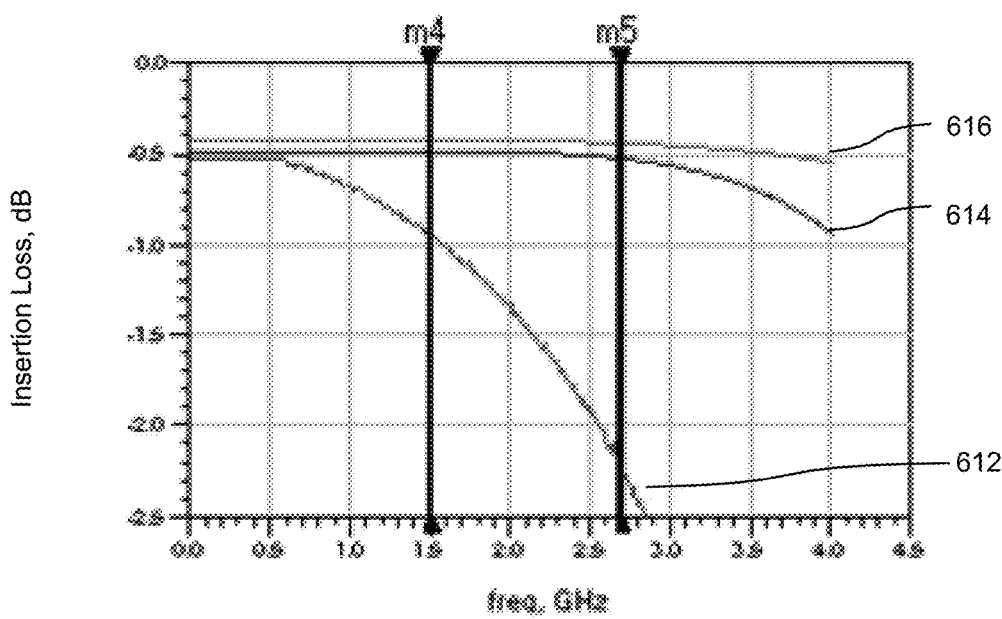
FIG. 6B is a graph comparing the insertion loss of the bypass path versus frequency for each of the three simulated circuit topologies from FIG. 1, FIG. 2, and FIG. 3.

FIG. 6B is a graph 610 comparing frequency versus the insertion loss of the bypass path for each of the three simulated circuit topologies from FIG. 1 (curve 612), FIG. 2 (curve 614), and FIG. 3 (curve 616). Point m4 represents a frequency of about 1.5 GHz, and point m5 represents a frequency of about 2.69 GHz. In contrast to the FIG. 6A results, the FIG. 2 (curve 614) and FIG. 3 (curve 616) circuit topologies have similar IL performance, with the FIG. 3 (curve 616) circuit topology being a little better at all frequencies, and significantly better at higher frequencies. The adverse effect of a non-isolated LNA (turned off) can be seen in the bypass IL of the FIG. 1 (curve 612) circuit topology, which worsens rapidly as frequency increases. In all simulations, the input series IL was optimized by using only an inductor for the input matching network; the severity of the degraded IL in the bypass path is very much dependent on the type of input matching network used. A different matching network circuitry could cause an even greater amount of IL degradation for the FIG. 1 (curve 612) circuit topology.

Comparing FIG. 6A and FIG. 6B, it is quite apparent that the novel circuit topology shown in FIG. 3 (curves 606, 616) has better overall IL performance than the circuit topologies of FIG. 1 (curves 602, 612) and of FIG. 2 (curves 604, 614) with their attendant tradeoff between bypass IL and input series IL.

Triple Mode Embodiments

The dual mode RF signal switch circuit 300 described above with respect to FIG. 3 provide a low loss signal path option as well as a bypass path option that is isolated from external circuitry (e.g., an isolation and/or insertion loss sensitive target circuit 304 such as an LNA or a digital step attenuator, directly or through an optional matching network 306). However, the RF signal switch circuit 300 is also useful in other circuit configurations. For example, the RF signal switch circuit 300 may be repurposed to provide a high loss signal path option in addition to maintaining a low loss signal path option and an isolated bypass signal path option. Providing a high loss signal path may be useful, for example, to enable gain tuning for the input to an LNA. As another example, rather than having a selectable high loss signal path, it may be desirable in some applications to selectively apply a signal function that intentionally alters an RF signal in a desired manner, such as by selectively altering signal phase and/or signal amplitude (e.g., by attenuation or amplification).

Figure 7:
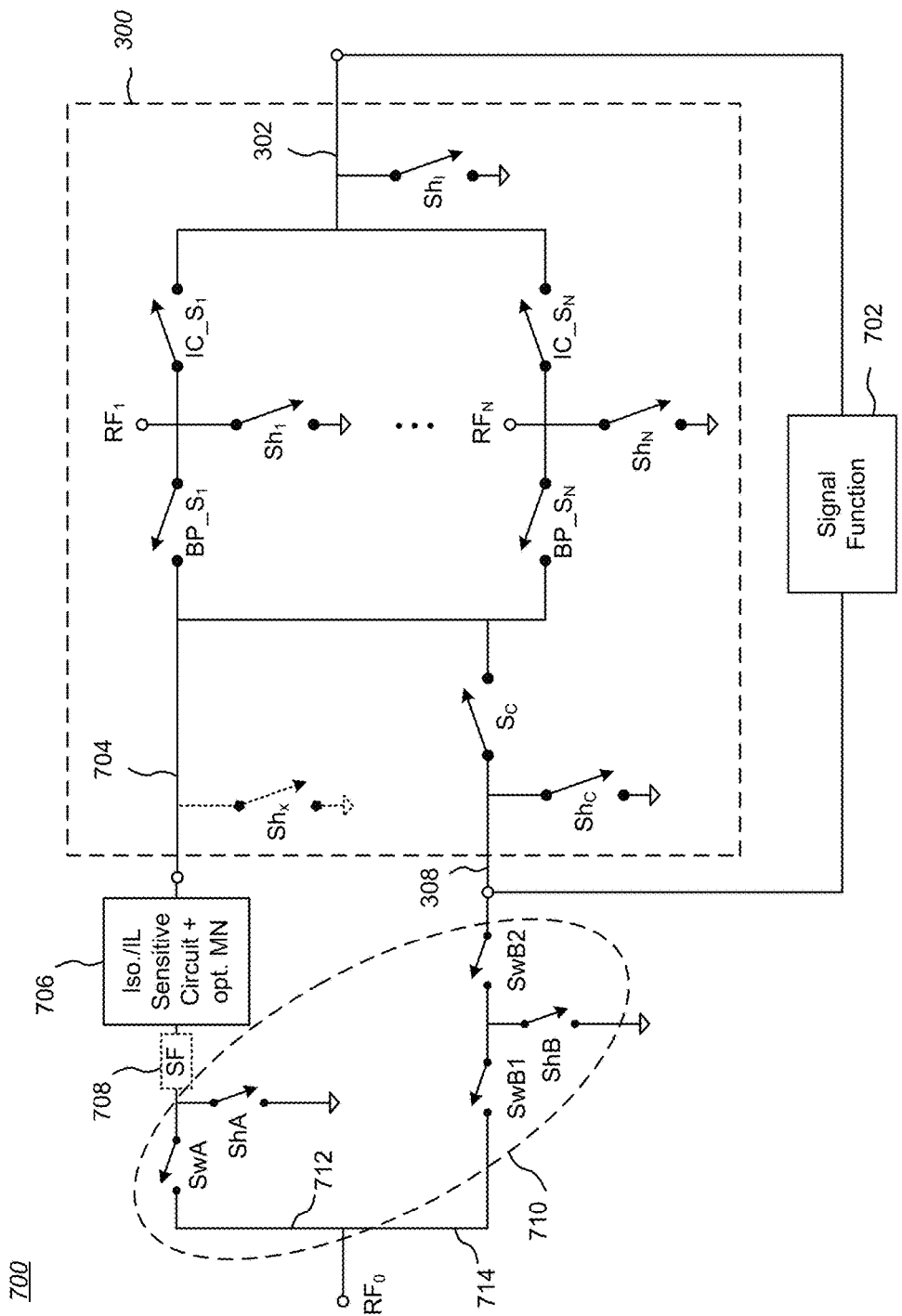
FIG. 7 is a schematic diagram of an embodiment of a triple-mode RF signal switch circuit in accordance with the present invention.

FIG. 7 is a schematic diagram of an embodiment of a triple-mode RF signal switch circuit 700 in accordance with the present invention. The RF signal switch circuit 300 of FIG. 3 is carried over, and is coupled by the in-circuit path 302 to a signal function circuit 702. The signal function circuit 702 may be, for example, one or more of a digital step attenuator (DSA), a digitally-controlled phase shifter, various types of amplifiers, or other circuitry that applies a signal function that intentionally alters an RF signal in a desired manner. A desirable characteristic of the signal function circuit 702 for many applications is that it have a selectable bypass mode that minimally alters an applied RF signal. Some or all of the signal function circuit 702 may be implemented as part of an integrated circuit (IC) chip that includes the RF signal switch circuit 300, or may be implemented as a separate IC and/or with some external components (e.g., large inductors or capacitors may be off-chip).

Examples of signal function circuits are described in U.S. Pat. No. 9,024,700, issued on May 5, 2015, entitled "Method and Apparatus for use in Digitally Tuning a Capacitor in an Integrated Circuit Device"; U.S. Pat. No. 9,197,194, issued on Nov. 24, 2015, entitled "Method and Apparatus for Use in Tuning Reactance in a Circuit Device"; U.S. Pat. No. 9,397,635, issued on Jul. 19, 2016, entitled "Segmented Attenuator with Glitch Reduction"; and U.S. Pat. No. 9,531,359, issued on Dec. 27, 2016, entitled "Improved Multi-State Attenuator"; all of which are hereby incorporated by reference.

A selectable signal path 704 of the RF signal switch circuit 300 is coupled to an isolation and/or insertion loss sensitive target circuit 706 that may include, for example, an LNA, an impedance matching network, and/or other circuitry. Again, some or all of the target circuit 706 may be implemented as part of an IC that includes the RF signal switch circuit 300, or may be implemented as a separate IC and/or with external components (e.g., large inductors or capacitors may be off-chip).

The target circuit 706 may be coupled to further circuitry, such as an optional signal function circuit 708 that provides the same or different signal function capability as the signal function circuit 702 (e.g., one or more of a DSA, a digitally-controlled phase shifter, various types of amplifiers, or other circuitry that applies a signal function that intentionally alters an RF signal in a desired manner). In some embodiments, the signal function circuit 708 may be provided alone in lieu of the signal function circuit 702. A desirable characteristic of the signal function circuit 708 for many applications is that it have an internal selectable bypass mode that minimally alters an applied RF signal. Again, some or all of the signal function circuit 708 may be implemented as part of an IC that includes the RF signal switch circuit 300, or may be implemented as a separate IC and/or with external components.

The target circuit 706 is coupled, directly or through the signal function circuit 708, to a switching network 710. The signal function circuit 702, if present, is also coupled to the switching network 710 and to the switch return path 308 (if the switching network 710 is omitted, then the RF signal switch circuit 300 is coupled by the in-circuit path 302 to the switching network 710 and the switch return path 308). The switching network 710 is coupled to an $RF_0$ port and includes two selectable signal paths. A first switch path 712 includes a series switch SwA coupled between the $RF_0$ port and a corresponding target circuit 706, and a corresponding shunt switch ShA coupled to a node between the series switch SwA and the corresponding target circuit 706 and configured selectively couple that node to circuit ground. A second switch path 714 includes a first and second series switches SwB1, SwB2, and a corresponding shunt switch ShB coupled to a node between the first and second series switches SwB1, SwB2 and configured to selectively couple that node to circuit ground. The switching network 710 may be implemented as part of an IC that includes the RF signal switch circuit 300, and/or may be implemented as a separate IC.

While RF signal switch circuit 300 of FIG. 3 is carried over, the operation of some of its internal switches has been changed to modify RF signal paths to and from the $RF_1$-$RF_N$ ports for different modes. More specifically, any of three signal path modes can be selected: a bypass mode, a low loss mode, or a signal function mode. To avoid confusion, the internal switches of the RF signal switch circuit 300 retain the reference labels used in FIG. 3, even though some RF signal paths perform different functions than in FIG. 3, as further described below. Note also that the various ports, $RF_0$ and $RF_1$-$RF_N$, are inherently bidirectional, and thus can be coupled to other circuit elements as input ports and/or as output ports.

Figure 8A:
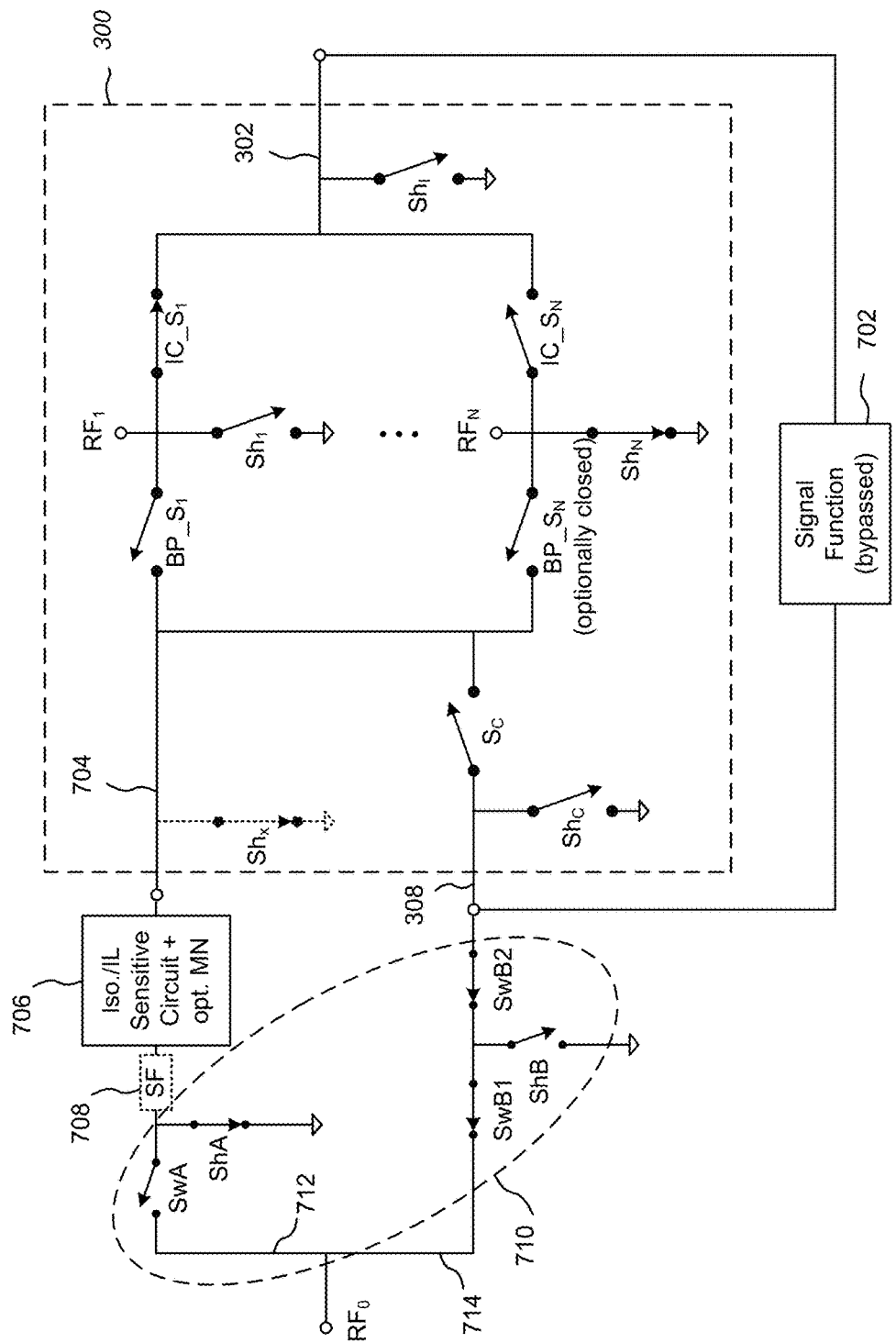
FIG. 8A is a schematic diagram of the embodiment shown in FIG. 7 configured in a bypass mode.

FIG. 8A is a schematic diagram of the embodiment shown in FIG. 7 configured in a bypass mode. In this mode, the switches of the RF signal switch circuit 300 and of the switching network 710 are set to convey an RF signal between the $RF_0$ port and a selected one of the $RF_1$-$RF_N$ ports while isolating the target circuit 706. For example, the $RF_0$ port may be coupled to the $RF_1$ port by closing series switches SwB1, SwB2, and IC_S1, opening all other series switches (with the possible exception of at least one bypass switch BP_$S_x$, see next paragraph), opening shunt switches ShB, $Sh_1$, and $Sh_C$, and closing all other shunt switches. In addition, the signal function circuit 702 would be set internally to a bypass state. In such a configuration, the target circuit 706 is isolated from the active bypass signal path between the $RF_0$ port and the $RF_1$ port.

The example switch configuration for coupling port $RF_0$ to port $RF_1$ provides a degree of isolation for the target circuit 706. For better isolation in the bypass mode, the bypass switch BP_$S_x$ of at least one RF port (e.g., $RF_2$-$RF_N$) not involved in the signal path conveying the RF signal may be closed, creating a connection to circuit ground for the selectable signal path 704 through the corresponding closed shunt switch. Thus, for example, referring to the example in FIG. 8A, bypass switch BP_$S_N$ and shunt switch $Sh_N$ may both be closed in the bypass mode to provide greater isolation for the target circuit 706. Alternatively, an extra shunt switch $Sh_x$ (shown in dotted outline in FIGS. 7 and 8A-8C) may be provided between the selectable signal path 704 and circuit ground. Closing the extra shunt switch $Sh_x$ in the bypass mode would enable extra isolation for the target circuit 706; the extra shunt switch $Sh_x$ would normally be open for all other modes.

Figure 8B:
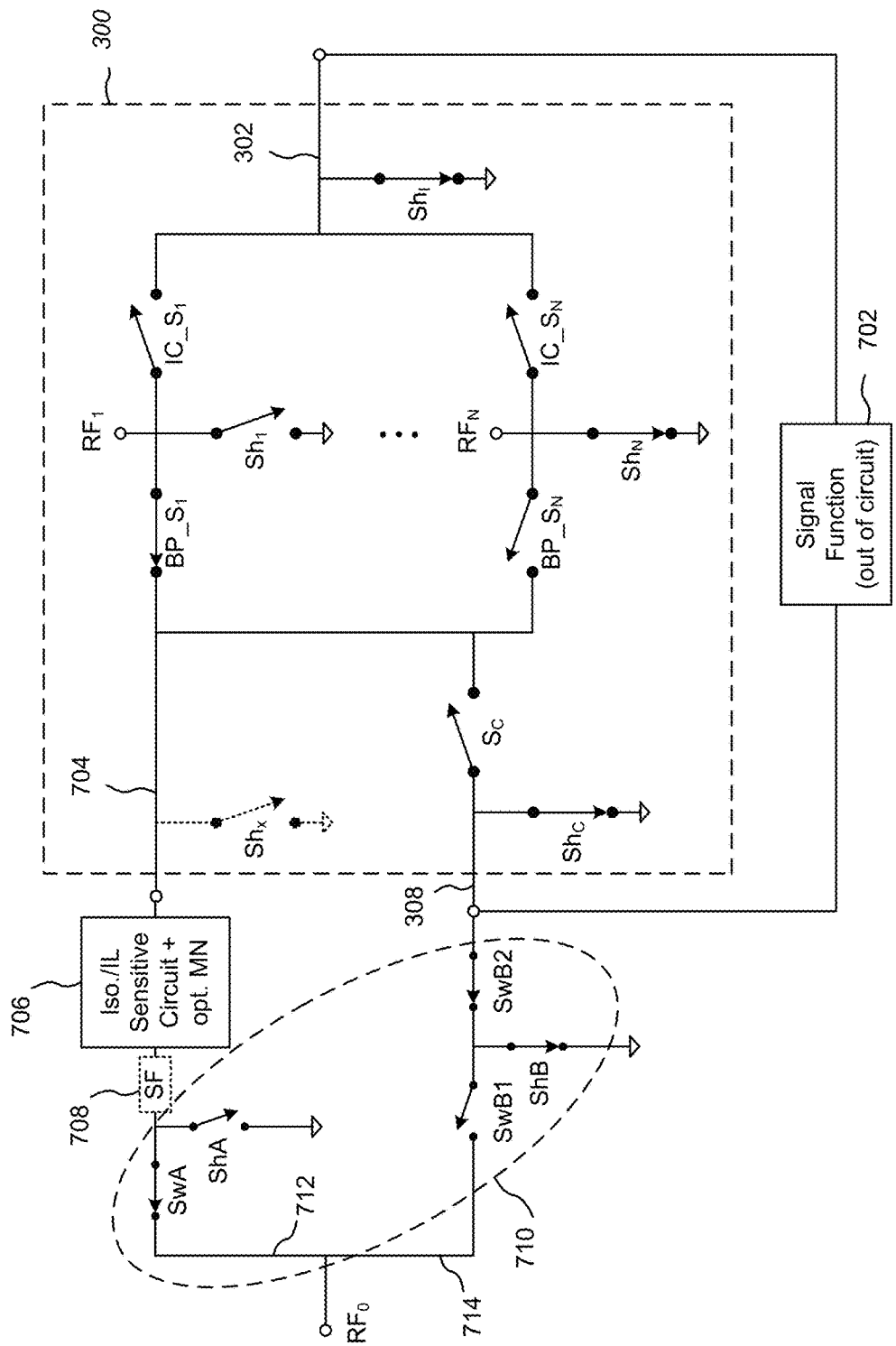
FIG. 8B is a schematic diagram of the embodiment shown in FIG. 3 configured in a low loss mode.

FIG. 8B is a schematic diagram of the embodiment shown in FIG. 3 configured in a low loss mode. In this mode, the switches of the RF signal switch circuit 300 and of the switching network 710 are set to convey an RF signal between the $RF_0$ port and a selected one of the $RF_1$-$RF_N$ ports through the target circuit 706. For example, the $RF_0$ port may be coupled to the $RF_1$ port through the target circuit 706 by closing series switches SwA and BP_$S_1$, opening all other series switches connected to a path conveying an RF signal (thus, switch SwB2 may either be closed, as shown in FIG. 8B, or opened, since it would not be connected to a path conveying an RF signal because switches SwB1 and Sc would be open), opening shunt switches ShA and $Sh_1$, and closing all other shunt switches. In such a configuration, the target circuit 706 coupled on a low loss signal path between the $RF_0$ port and the $RF_1$ port. As in the case of the low loss in-circuit mode of the dual-mode configuration of FIG. 4A, an RF signal need only traverse through one input series switch and a total of two series switches (albeit different switches), thus keeping insertion loss low.

Figure 8C:
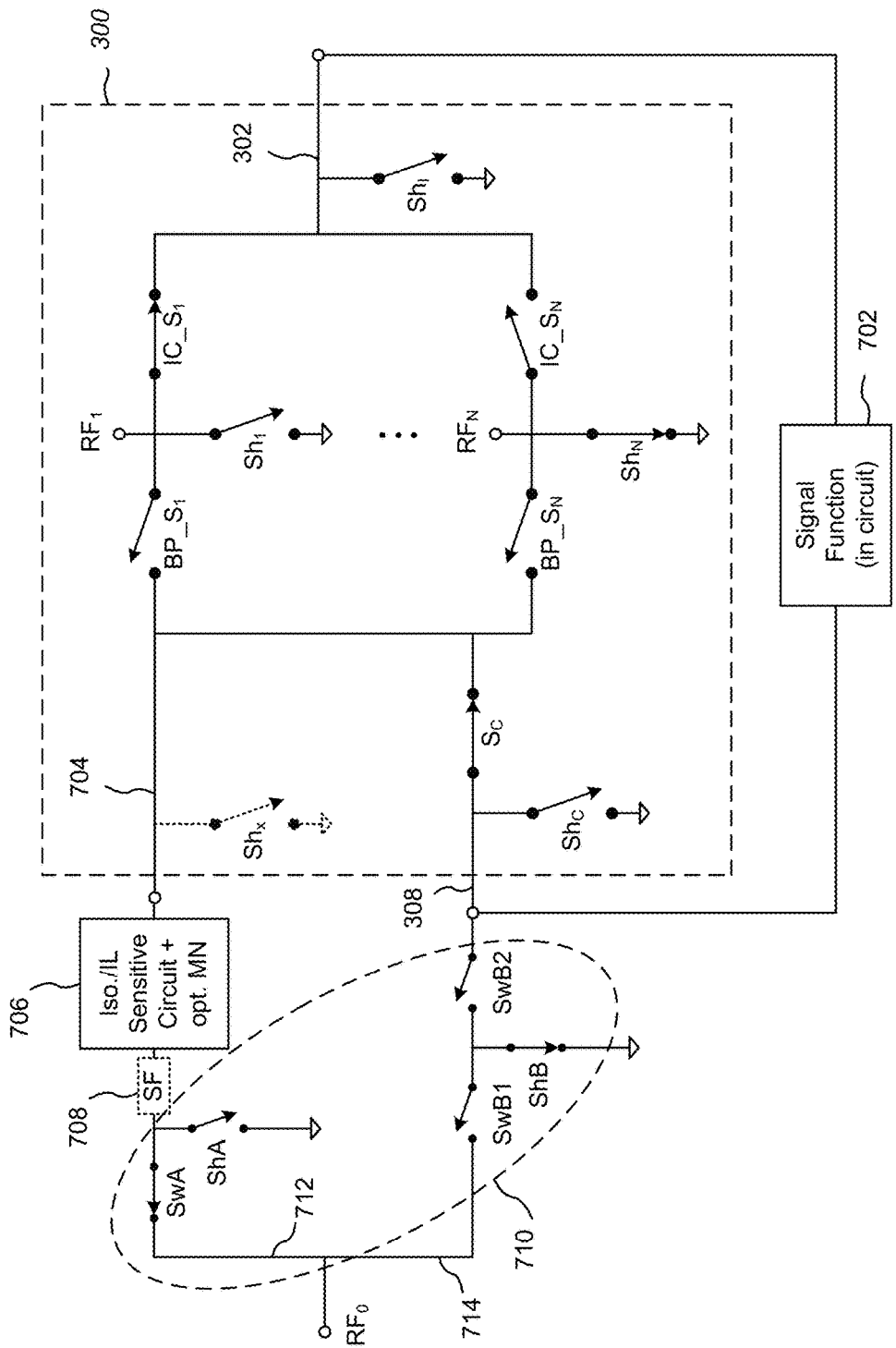
FIG. 8C is a schematic diagram of the embodiment shown in FIG. 3 configured in a signal function mode.

FIG. 8C is a schematic diagram of the embodiment shown in FIG. 3 configured in a signal function mode. In this mode, the switches of the RF signal switch circuit 300 and of the switching network 710 are set to convey an RF signal between the $RF_0$ port and a selected one of the $RF_1$-$RF_N$ ports through the target circuit 706 and through the signal function circuit 702. For example, the $RF_0$ port may be coupled to the $RF_1$ port through the target circuit 706 and the signal function circuit 702 by closing series switches SwA, $S_C$, and IC_S1, opening all other series switches, opening shunt switches ShA, $Sh_C$, and $Sh_1$, and closing all other shunt switches. In such a configuration, the target circuit 706 coupled on a signal path between the $RF_0$ port and the $RF_1$ port through the signal function circuit 702, which may apply a desired signal modification function (e.g., phase shift and/or amplitude modification, such as by attenuation or amplification).

Thus, in effect, the RF signal switch circuit 300 of FIG. 3 has been reconfigured such that the original bypass signal paths (through the BP_Sx series switches) are repurposed as low loss signal paths, and the original low loss signal paths (through the IC_Sx series switches) are repurposed as signal function (e.g., high loss) signal paths. In addition, the added switching capability of the switching network 710 maintains the option of bypass signal paths (through the IC_Sx series switches) that are isolated from the target circuit 706.

As is the case with the RF signal switch circuit 300 of FIG. 3, in alternative embodiments of the RF signal switch circuit 700, each of the RF input terminals $RF_1$-$RF_N$ may have one or more sets of in-path connector series switch IC_$S_x$, and corresponding isolation shunt switches $Sh_I$ connected to parallel in-circuit paths. Such a configuration would, for example, allow multiple antennas to be selectively coupled to multiple target circuits without increasing the number of series switches to any one target circuit. In other embodiments, multiple target circuits 706 may be included, with concomitant replication of the first switch path 712 of the switching network 710 to provide corresponding connections to the $RF_0$ port.

All of the switches described above for FIG. 7 may be controlled by external switching circuitry (not shown) of conventional design to set either open states or closed states for the switches. One or more of the switches shown in FIGS. 3 and 7 may be of any type, but are beneficially fabricated as field effect transistors (FETs), and particularly as MOSFETs, on an integrated circuit.

Other circuitry may be included in the triple-mode RF signal switch circuit 700 as desired or needed for particular applications. For example, in some applications, it may be desirable to insert a fixed attenuation circuit in line with the bypass signal path to provide a minimum amount of attenuation to applied RF signal. As another example, if even higher isolation of the target circuit 706 is desired, some or all of the switches coupled to the target circuit 706 may be replaced by a "T" type series/shunt/series circuit bypass switch configuration of the type shown in FIG. 5.

Methods

Another aspect of the invention includes a method for switching RF signals, including:
a. providing at least one RF input port having a shunt switch, a bypass switch, and an in-path connector switch;
b. coupling each in-path connector switch to an in-circuit path, the in-circuit path being configured to be coupled to an input of a target circuit;
c. coupling each bypass switch to a switch output port;
d. coupling each shunt switch to circuit ground;
e. coupling an isolation shunt switch to the in-circuit path;
f. providing a switch return path, the switch return path being configured to be coupled to an output of the target circuit;
g. coupling an output connector shunt switch to the switch return path; and
h. coupling an output connector switch to the switch return path and to the switch output port.

Yet another aspect of the invention encompasses the first method set forth above, further including configuring an in-circuit mode for a selected RF input port by:
a. setting the shunt switch and bypass switch for the selected RF input port to an open state, setting the in-path connector switch for the selected RF input port to a closed state, setting the isolation shunt switch to an open state, setting the output connector shunt switch to an open state, and setting the output connector switch to a closed state; and
b. for each other RF input port, setting the respective in-path connector switch and bypass switch to an open state, and setting the respective shunt switch to a closed state.

Still another aspect of the invention encompasses the first method set forth above, further including configuring a bypass mode for a selected RF input port by:
a. setting the shunt switch and the in-path connector switch for the selected RF input port to an open state, setting the bypass switch for the selected RF input port to a closed state, setting the isolation shunt switch to a closed state, setting the output connector shunt switch to a closed state, and setting the output connector switch to an open state; and
b. for each other RF input port, setting the respective in-path connector switch and bypass switch to an open state, and setting the respective shunt switch to a closed state.

Another aspect of the above methods is configuring each bypass switch as a "T" type series/shunt/series circuit, and (a) for an active signal path in the bypass mode, setting a first series switch and a second series switch to a closed state, and setting a shunt switch to an open state; and (b) for an active signal path in the in-circuit mode and for inactive signal paths in either mode, setting the first series switch and the second series switch to an open state, and setting the shunt switch to a closed state.

Still another aspect of the invention is a method of switching RF signals, including providing at least one first type RF signal port, each first type RF signal port having a first shunt switch coupled to the first type RF signal port and configured to selectively couple the first type RF signal port to circuit ground, a first series switch coupled between the first type RF signal port and configured to be coupled to at least one corresponding target circuit, and at least one set of second series switches coupled to the first type RF signal port; coupling at least one first circuit path to a corresponding second shunt switch and coupled to a corresponding one set of second series switches, each first circuit path being configured to be coupled to at least one signal function circuit; providing at least one second circuit path configured to be coupled to the at least one signal function circuit, and being coupled to a corresponding third shunt switch; coupling at least one third series switch to a corresponding one second circuit path and to at least one first series switch; providing at least one second type RF signal port; and coupling a switching network to the at least one second type RF signal port, the switching network including at least one first switch path each having a series switch coupled to at least one second type RF signal port and configured to be coupled to one corresponding target circuit, and a shunt switch coupled to a node between such series switch and such corresponding target circuit and configured to selectively couple that node to circuit ground, and at least one second switch path each having a first series switch coupled to the at least one second type RF signal port, a second series switch coupled to the first series switch and to at least one second circuit path, and a shunt switch coupled to a node between the first and second series switches and configured to selectively couple that node to circuit ground.

The method immediately above may further include or be characterized by one or more of the following:
a. configuring a bypass mode for a selected first type RF signal port such that an applied RF signal passes between the selected first type RF signal port and at least one corresponding second type RF signal port through a corresponding second switch path of the switching network, a corresponding second circuit path, a corresponding first circuit path, and a corresponding second series switch of the selected first type RF signal port, such that each target circuit is isolated from the selected first type RF signal port and the at least one corresponding second type RF signal port;
b. configuring a bypass mode for a selected first type RF signal port, including closing at least one second series switch for the selected first type RF signal port, closing the first and second series switch of a corresponding second switch path of the switching network, opening all other series switches, opening the first shunt switch coupled to the selected first type RF signal part, opening the shunt switch coupled to each pair of closed first and second series switches of the corresponding second switch path of the switching network, opening the third shunt switch of the second circuit path corresponding to the pair of closed first and second series switches of the second switch path of the switching network, and closing all other shunt switches;
c. configuring a low loss mode for a selected first type RF signal port such that the selected first type RF signal port is coupled to at least one corresponding target circuit through only the first connector switch for the selected first type RF signal port and through no other switch;
d. configuring a low loss mode for a selected first type RF signal port, including closing the first series switch for the selected first type RF signal port, closing the series switch of at least one first switch path of the switch network, opening all other series switches, opening the first shunt switch for the selected first type RF signal port, opening the shunt switch corresponding to the closed series switch of the at least one first switch path of the switch network, and closing all other shunt switches;
e. configuring a signal function mode for a selected first type RF signal port such that the selected first type RF signal port is coupled to at least one corresponding target circuit through at least one signal function circuit;
f. configuring a signal function mode for a selected first type RF signal port, including closing at least one second series switch for the selected first type RF signal port, closing the third series switch of at least one second circuit path coupled to the closed second series switch for the selected first type RF signal port, closing the series switch of at least one first switch path of the switch network, opening all other series switches, opening the first shunt switch coupled to the selected first type RF signal part; opening the shunt switch corresponding to the closed series switch of the at least one first switch path of the switch network, opening the third shunt switch corresponding to each closed third series switch, and closing all other shunt switches;
g. coupling a signal function circuit between one first circuit path and one second circuit path, for selectively altering the phase and/or amplitude of an RF signal conveyed between the one circuit path and the one second circuit path;
h. coupling at least one target circuit between the series switch of at least one corresponding first switch path of the switching network and the first series switch of at least one first type RF signal port;
i. wherein at least one target circuit includes a low noise amplifier and/or an impedance matching network;
j. coupling at least one second signal function circuit between a corresponding target circuit and the series switch of at least one corresponding first switch path of the switching network; and/or
k. implementing each switch with at least one field effect transistor.

Uses

Circuits and devices in accordance with the present invention may be used alone or in combination with other components, circuits, and devices. Embodiments of the present invention may be fabricated as integrated circuits (ICs), which may be encased in IC packages and/or or modules for ease of handling, manufacture, and/or improved performance.

Embodiments of the present invention are useful in a wide variety of larger radio frequency (RF) circuits and systems for performing a range of functions, including (but not limited to) impedance matching circuits, RF power amplifiers (e.g., scalable periphery tunable matching power amplifiers and Doherty amplifiers), RF low-noise amplifiers (LNAs), phase shifters, attenuators, RF switches, etc. Such functions are useful in a variety of applications, such as radar systems (including phased array and automotive radar systems), radio systems (including cellular radio systems), and test equipment. Such circuits may be useful in systems operating over some or all of the RF range (e.g., from around 20 kHz to about 300 GHz).

Radio system usage includes wireless RF systems (including base stations, relay stations, and hand-held transceivers) that use various technologies and protocols, including various types of orthogonal frequency-division multiplexing ("ODFM"), quadrature amplitude modulation ("QAM"), Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency (RF) signal switch circuit, including:
   (a) at least one first type RF signal port, each first type RF signal port having:
       (1) a first shunt switch coupled to the first type RF signal port and configured to selectively couple the first type RF signal port to circuit ground,
       (2) a first series switch coupled between the first type RF signal port and at least one corresponding second type RF signal port, and
       (3) at least one set of second series switches coupled to the first type RF signal port;
   (b) at least one first circuit path each coupled to a corresponding second shunt switch and coupled to a corresponding one set of second series switches, each first circuit path being configured to be coupled to at least one target circuit;
   (c) at least one second circuit path configured to be coupled to at least one target circuit, and being coupled to a corresponding third shunt switch; and
   (d) at least one third series switch coupled to a corresponding one second circuit path and to at least one corresponding second type RF signal port;
   wherein each switch is implemented with at least one field effect transistor.

2. A radio frequency (RF) signal switch circuit, including:
   (a) at least one first type RF signal port, each first type RF signal port having:
       (1) a first shunt switch coupled to the first type RF signal port and configured to selectively couple the first type RF signal port to circuit ground,
       (2) a first series switch coupled between the first type RF signal port and configured to be coupled to at least one corresponding target circuit, and
       (3) at least one set of second series switches coupled to the first type RF signal port;
   (b) at least one first circuit path each coupled to a corresponding second shunt switch and coupled to a corresponding one set of second series switches, each first circuit path being configured to be coupled to at least one signal function circuit;
   (c) at least one second circuit path configured to be coupled to the at least one signal function circuit, and being coupled to a corresponding third shunt switch;
   (d) at least one third series switch coupled to a corresponding one second circuit path and to at least one first series switch;
   (e) at least one second type RF signal port; and
   (f) a switching network coupled to the at least one second type RF signal port, the switching network including:
       (1) at least one first switch path each having a series switch coupled to at least one second type RF signal port and configured to be coupled to one corresponding target circuit, and a shunt switch coupled to a node between such series switch and such corresponding target circuit and configured to selectively couple that node to circuit ground, and
       (2) at least one second switch path each having a first series switch coupled to the at least one second type RF signal port, a second series switch coupled to the first series switch and to at least one second circuit path, and a shunt switch coupled to a node between the first and second series switches and configured to selectively couple that node to circuit ground.

3. The invention of claim 2, wherein the RF signal switch circuit is configured in a bypass mode for a selected first type RF signal port such that an applied RF signal passes between the selected first type RF signal port and at least one corresponding second type RF signal port through a corresponding second switch path of the switching network, a corresponding second circuit path, a corresponding first circuit path, and a corresponding second series switch of the selected first type RF signal port, such that each target circuit is isolated from the selected first type RF signal port and the at least one corresponding second type RF signal port.

4. The invention of claim 2, wherein the RF signal switch circuit is configured in a bypass mode for a selected first type RF signal port in which:
   (a) at least one second series switch for the selected first type RF signal port is closed;
   (b) the first and second series switch of a corresponding second switch path of the switching network are closed;
   (c) all other series switches are open;
   (d) the first shunt switch coupled to the selected first type RF signal part is open;
   (e) the shunt switch coupled to each pair of closed first and second series switches of the corresponding second switch path of the switching network is open;
   (f) the third shunt switch of the second circuit path corresponding to the pair of closed first and second series switches of the second switch path of the switching network is open; and
   (g) all other shunt switches are closed.

5. The invention of claim 2, wherein the RF signal switch circuit is configured in a low loss mode for a selected first type RF signal port such that the selected first type RF signal port is coupled to at least one corresponding target circuit through only the first series switch for the selected first type RF signal port and through no other switch.

6. The invention of claim 2, wherein the RF signal switch circuit is configured in a low loss mode for a selected first type RF signal port in which:
   (a) the first series switch for the selected first type RF signal port is closed;
   (b) the series switch of at least one first switch path of the switch network is closed;
   (c) all other series switches connected to a path conveying an RF signal are open;
   (d) the first shunt switch for the selected first type RF signal port is open;
   (e) the shunt switch corresponding to the closed series switch of the at least one first switch path of the switch network is open; and
   (f) all other shunt switches are closed.

7. The invention of claim 2, wherein the RF signal switch circuit is configured in a signal function mode for a selected first type RF signal port such that the selected first type RF signal port is coupled to at least one corresponding target circuit through at least one signal function circuit.

8. The invention of claim 2, wherein the RF signal switch circuit is configured in a signal function mode for a selected first type RF signal port in which:
(a) at least one second series switch for the selected first type RF signal port is closed;
(b) the third series switch of at least one second circuit path coupled to the closed second series switch for the selected first type RF signal port is closed;
(c) the series switch of at least one first switch path of the switch network is closed;
(d) all other series switches are open;
(e) the first shunt switch coupled to the selected first type RF signal part is open;
(f) the shunt switch corresponding to the closed series switch of the at least one first switch path of the switch network is open;
(g) the third shunt switch corresponding to each closed third series switch is open; and
(h) all other shunt switches are closed.

9. The invention of claim 2, further including a signal function circuit coupled between one first circuit path and one second circuit path, for selectively altering the phase and/or amplitude of an RF signal conveyed between the one circuit path and the one second circuit path.

10. The invention of claim 2, further including at least one target circuit coupled between the series switch of at least one corresponding first switch path of the switching network and the first series switch of at least one first type RF signal port.

11. A method of switching radio frequency (RF) signals, including:
(a) providing at least one first type RF signal port, each first type RF signal port having:
 (1) a first shunt switch coupled to the first type RF signal port and configured to selectively couple the first type RF signal port to circuit ground,
 (2) a first series switch coupled between the first type RF signal port and configured to be coupled to at least one corresponding target circuit, and
 (3) at least one set of second series switches coupled to the first type RF signal port;
(b) coupling at least one first circuit path to a corresponding second shunt switch and coupled to a corresponding one set of second series switches, each first circuit path being configured to be coupled to at least one signal function circuit;
(c) providing at least one second circuit path configured to be coupled to the at least one signal function circuit, and being coupled to a corresponding third shunt switch;
(d) coupling at least one third series switch to a corresponding one second circuit path and to at least one first series switch;
(e) providing at least one second type RF signal port; and
(f) coupling a switching network to the at least one second type RF signal port, the switching network including:
 (1) at least one first switch path each having a series switch coupled to at least one second type RF signal port and configured to be coupled to one corresponding target circuit, and a shunt switch coupled to a node between such series switch and such corresponding target circuit and configured to selectively couple that node to circuit ground, and
 (2) at least one second switch path each having a first series switch coupled to the at least one second type RF signal port, a second series switch coupled to the first series switch and to at least one second circuit path, and a shunt switch coupled to a node between the first and second series switches and configured to selectively couple that node to circuit ground.

12. The method of claim 11, further including configuring a bypass mode for a selected first type RF signal port such that an applied RF signal passes between the selected first type RF signal port and at least one corresponding second type RF signal port through a corresponding second switch path of the switching network, a corresponding second circuit path, a corresponding first circuit path, and a corresponding second series switch of the selected first type RF signal port, such that each target circuit is isolated from the selected first type RF signal port and the at least one corresponding second type RF signal port.

13. The method of claim 11, further including configuring a bypass mode for a selected first type RF signal port, including:
(a) closing at least one second series switch for the selected first type RF signal port;
(b) closing the first and second series switch of a corresponding second switch path of the switching network;
(c) opening all other series switches;
(d) opening the first shunt switch coupled to the selected first type RF signal part;
(e) opening the shunt switch coupled to each pair of closed first and second series switches of the corresponding second switch path of the switching network;
(f) opening the third shunt switch of the second circuit path corresponding to the pair of closed first and second series switches of the second switch path of the switching network; and
(g) closing all other shunt switches.

14. The method of claim 11, further including configuring a low loss mode for a selected first type RF signal port such that the selected first type RF signal port is coupled to at least one corresponding target circuit through only the first series switch for the selected first type RF signal port and through no other switch.

15. The method of claim 11, further including configuring a low loss mode for a selected first type RF signal port, including:
(a) closing the first series switch for the selected first type RF signal port;
(b) closing the series switch of at least one first switch path of the switch network;
(c) opening all other series switches connected to a path conveying an RF signal;
(d) opening the first shunt switch for the selected first type RF signal port;
(e) opening the shunt switch corresponding to the closed series switch of the at least one first switch path of the switch network; and
(f) closing all other shunt switches.

16. The method of claim 11, further including configuring a signal function mode for a selected first type RF signal port such that the selected first type RF signal port is coupled to at least one corresponding target circuit through at least one signal function circuit.

17. The method of claim 11, further including configuring a signal function mode for a selected first type RF signal port, including:

(a) closing at least one second series switch for the selected first type RF signal port;
(b) closing the third series switch of at least one second circuit path coupled to the closed second series switch for the selected first type RF signal port;
(c) closing the series switch of at least one first switch path of the switch network;
(d) opening all other series switches;
(e) opening the first shunt switch coupled to the selected first type RF signal part;
(f) opening the shunt switch corresponding to the closed series switch of the at least one first switch path of the switch network;
(g) opening the third shunt switch corresponding to each closed third series switch; and
(h) closing all other shunt switches.

18. The method of claim 11, further including coupling a signal function circuit between one first circuit path and one second circuit path, for selectively altering the phase and/or amplitude of an RF signal conveyed between the one circuit path and the one second circuit path.

19. The method of claim 11, further including coupling at least one target circuit between the series switch of at least one corresponding first switch path of the switching network and the first series switch of at least one first type RF signal port.

* * * * *